United States Patent [19]
Li et al.

[11] Patent Number: 6,075,724
[45] Date of Patent: Jun. 13, 2000

[54] METHOD FOR SORTING SEMICONDUCTOR DEVICES HAVING A PLURALITY OF NON-VOLATILE MEMORY CELLS

[75] Inventors: Xiao-Yu Li; Sunil D. Mehta, both of San Jose, Calif.

[73] Assignee: Vantis Corporation, Sunnyvale, Calif.

[21] Appl. No.: 09/255,410

[22] Filed: Feb. 22, 1999

[51] Int. Cl.$^7$ .................................................. G11C 16/04
[52] U.S. Cl. ................ 365/185.18; 365/201; 365/185.09
[58] Field of Search .......................... 365/185.18, 185.09, 365/185.02, 201

[56] References Cited

U.S. PATENT DOCUMENTS

| | | | |
|---|---|---|---|
| 4,963,825 | 10/1990 | Mielke | 365/201 |
| 5,687,120 | 11/1997 | Chang et al. | 365/185.18 |
| 5,700,698 | 12/1997 | Barsan et al. | 438/17 |

*Primary Examiner*—Huan Hoang
*Attorney, Agent, or Firm*—Brinks Hofer Gilson & Lione

[57] ABSTRACT

A method for sorting semiconductor devices having a plurality of non-volatile memory cells effectively screens memory cells with a predicted lifetime less than a desired lifetime, in part, by determining a minimum acceptable voltage value and a maximum acceptable voltage drop value for each cell in the device at a margin sort read point. In the method of the invention, the device is first stressed by programming and erasing the memory cells for a predetermined number of cycles. After stressing the device, the device is erased and an initial voltage across a floating-gate is measured at time=0. The initial voltage value is compared with acceptable minimum and maximum initial voltages. The device is discarded if the initial voltage value is outside of the range defined by the minimum and maximum initial voltages. Next, the device is baked at a predetermined temperature. Then, a voltage drop value is determined by measuring a second voltage on the floating-gate at the margin sort read point. The device is identified as defective and discarded if both the second voltage value of any cell is below the predetermined minimum value, and if the voltage drop value of the cell exceeds a predetermined maximum voltage drop value.

20 Claims, 3 Drawing Sheets

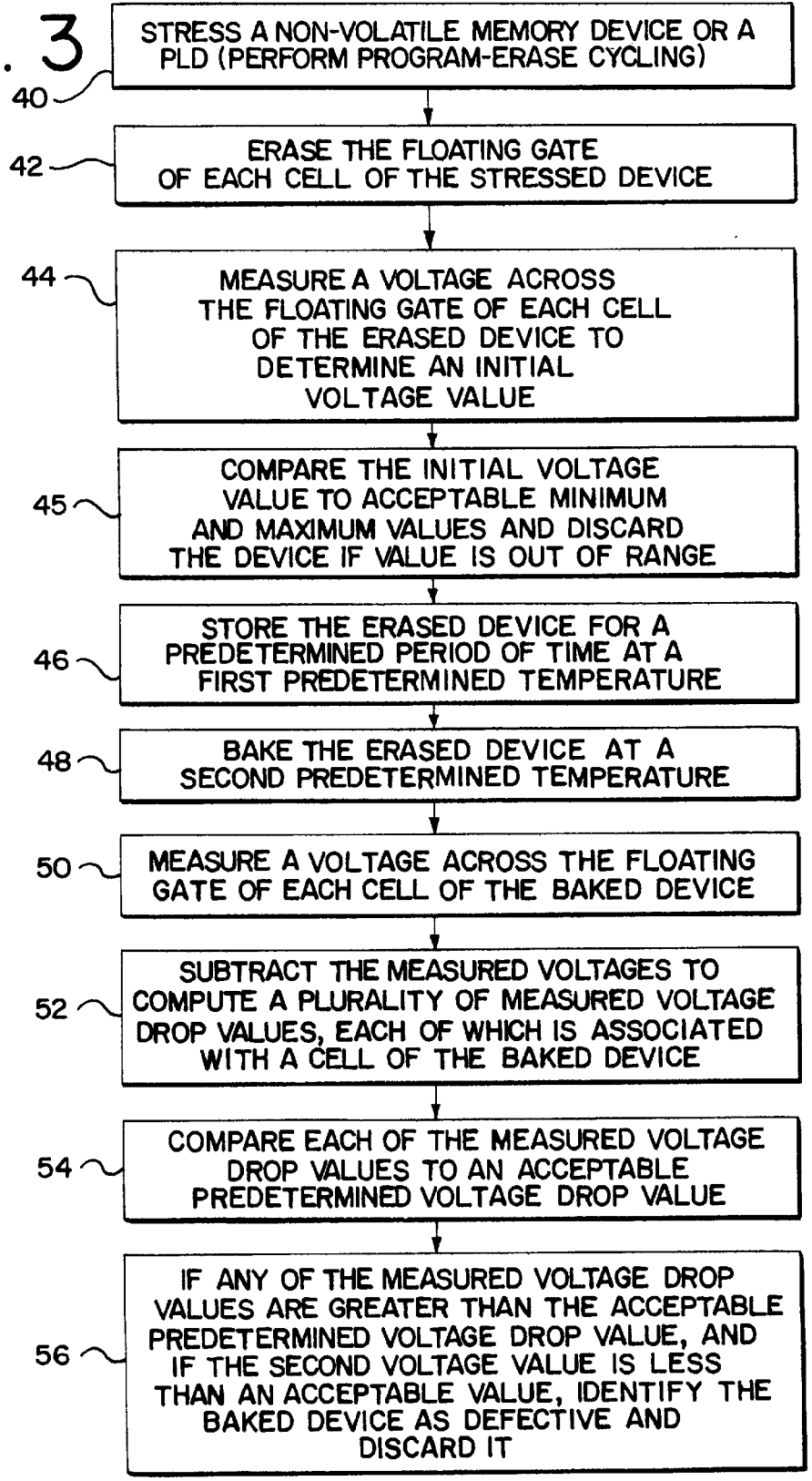

METHOD FOR SORTING SEMICONDUCTOR DEVICES HAVING A PLURALITY OF NON-VOLATILE MEMORY CELLS

FIELD OF THE INVENTION

This invention relates, generally, to quality control methods used in the fabrication of semiconductor devices having non-volatile memory cells, and more particularly, to methods for identifying non-volatile memory devices having defective tunnel oxide layers damaged by program-erase cycling stress, and by high-temperature activated charge loss.

BACKGROUND OF THE INVENTION

Non-volatile semiconductor devices, such as EEPROM devices, are both electrically erasable and programmable. Such devices retain data even after the power is terminated to the device. Non-volatile memory devices have a limited lifetime due to the endurance related stress such devices suffer each time they go through a program-erase cycle. The endurance of non-volatile memory devices is defined as the number of program/erase cycles that the memory device is capable of undergoing before device failure.

The main charge storage component of a non-volatile memory cell is a floating-gate electrode. Electrical charge is placed on the floating-gate electrode by transferring electrons from an underlying substrate to the floating-gate electrode through a tunnel oxide layer. The storage and removal of charge on the floating-gate electrode is the operative means by which data is stored in a non-volatile memory cell. The presence or absence of charge in the floating-gate electrode is determined by measuring the threshold voltage of a metal-oxide-semiconductor (MOS) transistor that is activated by the floating-gate electrode.

The threshold voltage of an MOS transistor is the minimum amount of voltage that must be applied to the gate electrode of the transistor before the transistor is turned "on." When the MOS transistor is turned on, electrical conduction takes place between the source and drain regions of the transistor. The presence or absence of charge on the floating-gate electrode is determined by measuring the amount of voltage necessary to turn the MOS transistor on. The threshold voltage of an MOS transistor having a floating-gate electrode will vary depending upon whether or not charge has been placed on the floating-gate electrode.

To cause electrons to transfer between the substrate and the floating-gate electrode, voltage potentials are applied to the substrate and to the source and drain regions, such that potential gradients are set up across an oxide layer underlying the floating-gate electrode. In one type of non-volatile memory device, the device is programmed by applying a high positive voltage to a control-gate electrode, and a low positive voltage to the drain region of the MOS transistor. These applied voltages transfer electrons from the substrate through the oxide layer and into the floating-gate electrode by hot carrier injection. Conversely, the device is erased by grounding the substrate, and applying a high positive voltage to either the source or drain region of the MOS transistor. Under erase voltage conditions, electrons are removed from the floating-gate electrode and enter either the source or drain region in the semiconductor substrate.

In another type of non-volatile memory device used in programmable-logic-devices (PLDs), electron transfer is carried out by Fowler-Nordheim tunneling. A control-gate or program junction region (PJR) is formed in the substrate and is capacitively coupled to the floating-gate electrode. A voltage applied to the PJR is coupled to the floating-gate electrode, such that electrons tunnel through a tunnel oxide layer located between the PJR and the floating-gate electrode.

Over time, the data storage cells in the non-volatile memory device will be written and erased repeatedly as data is stored and removed from the various memory cells within the device. Since data storage relies on charge exchange between the substrate and the floating-gate electrode, considerable stress is placed on the tunnel oxide layer underlying the floating-gate electrode. The charge-induced stress in the tunnel oxide layer can cause charge trapping sites to form within the tunnel oxide. The formation of these charge trapping sites is undesirable, because, once formed, electrical current can leak through the tunnel oxide layer from the floating-gate electrode to the substrate. When charge leaks off the floating-gate electrode, a data error occurs in the memory cell. The charge loss from the floating-gate electrode caused by leakage through the tunnel oxide layer has not been a significant problem for devices having tunnel oxide thickness greater than about 100 angstroms. However, as non-volatile memory devices are scaled to smaller dimensions the thickness of the tunnel oxide layer is reduced to about 90 angstroms or less. At oxide thicknesses on the order of about 90 angstroms, the tunnel oxide layer more readily suffers program/erase cycling stress that results in premature device failure. Accordingly, screening for charge loss caused by tunnel oxide stress is of significant concern in non-volatile memory quality control procedures.

SUMMARY OF THE INVENTION

The present invention is for a method for sorting semiconductor devices having a plurality of non-volatile memory cells. The method of the invention provides an improved sorting procedure that includes an initial screening step of determining an initial voltage value across the floating-gate of each memory cell in the device, and comparing the initial value to minimum and maximum acceptable values. After baking the device at a predetermined temperature, the voltage is again measured across the floating-gate of each memory cell at the margin sort read point to determine a second voltage value. A voltage drop value is determined by subtracting the second voltage value from the initial voltage value. In accordance with the invention, a device is considered to fail if the second voltage value of any cell at the margin sort read point is below a predetermined value, and if the voltage drop value of the cell exceeds a predetermined maximum voltage drop value. By requiring a memory cell to have a voltage that exceeds a minimum value at the margin sort read point, memory cells can be screened out that will fail prematurely and not achieve a minimum acceptable lifetime. Additionally, by requiring that a memory cell not exceed a specified voltage drop value at the margin sort read point, cells having initially defective tunnel oxide layers are also screened out. The screening process of the invention provides a high level of discrimination in non-volatile memory quality control. Accordingly, non-volatile memory cells having tunnel oxide layers less than 100 angstroms in thickness can be effectively evaluated and overall product quality improved.

In one form, the method of the invention includes alternatingly programming and erasing a plurality of memory cells to provide a stressed non-volatile memory device. Next, the memory cells of the device are erased and an initial voltage value is determined by measuring the voltage across the floating-gate of each memory cell. The non-volatile memory device is then baked at a predetermined temperature. Following the baking process, a second voltage value is measured across the floating-gate of each memory cell. A voltage drop value is determined by subtracting the second voltage value from the initial voltage value. The non-volatile memory device is discarded if: 1) the second voltage value of any cell is below a predetermined minimum value; and 2) if the voltage drop value of the cell exceeds a predetermined maximum voltage drop value.

BRIEF DESCRIPTION OF THE DRAWINGS

FIG. 3 is a flow chart showing a method for sorting non-volatile memory devices in accordance with the invention.

DETAILED DESCRIPTION OF PREFERRED EMBODIMENTS

The present invention is related to an improved method for sorting non-volatile memory devices, and in particular, PLDs having non-volatile memory cells. The data retention capability of such devices is characterized by the data retention capability of the worst of weakest cell of the device. The present invention is also applicable to in-system updateable memory devices in which stored data can be erased and replaced under control of a system processor. The sorting method of the present invention is applicable to PLDs, as well as any memory device having non-volatile and in-system updateable capabilities, such as EEPROM devices, flash EEPROM devices, and the like.

Figure 1:
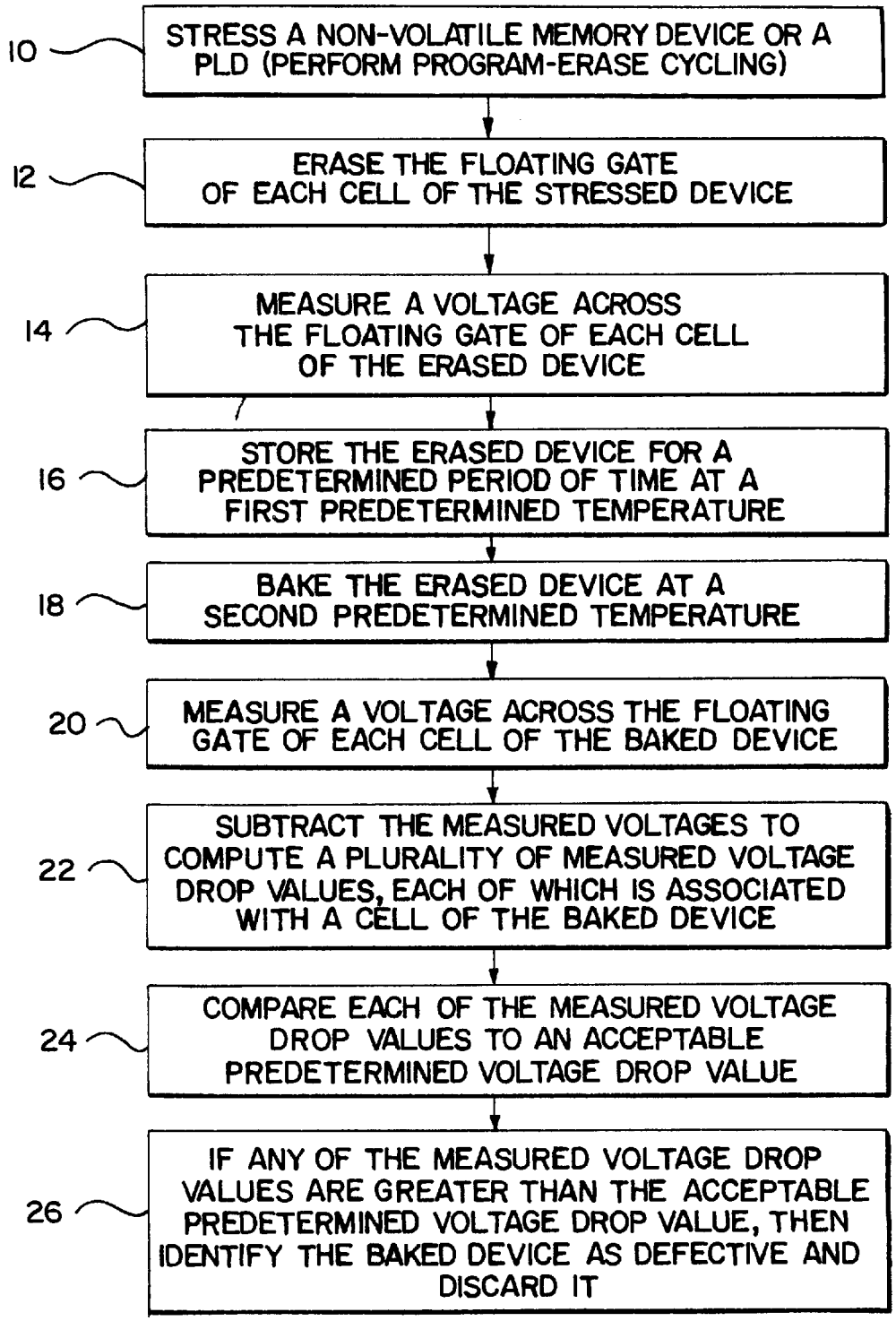
FIG. 1 is a flow chart illustrating a prior art method for sorting non-volatile memory devices.
Figure 2:
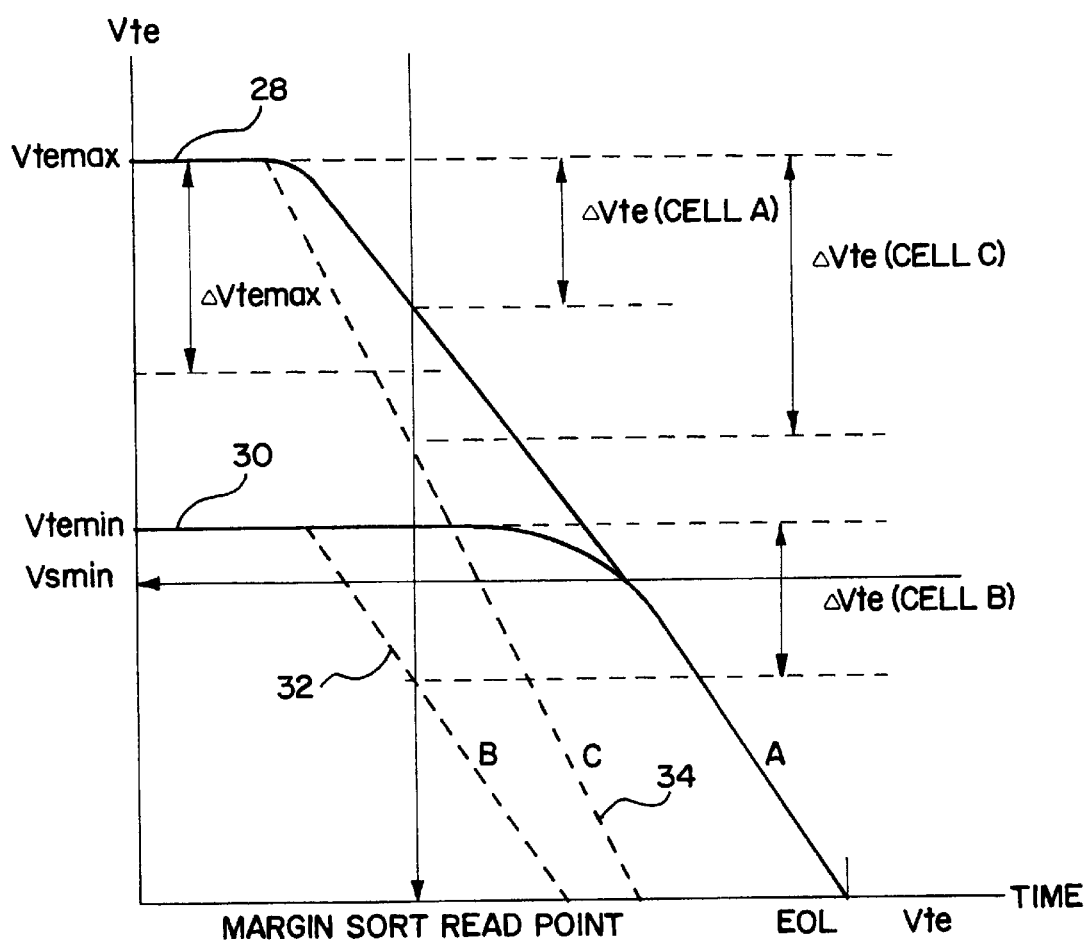
FIG. 2 is a plot of applied voltage needed to erase a non-volatile memory cell versus time.

FIG. 2 depicts one type sorting process presently used to screen out non-volatile memory devices having defective memory cells. Those skilled in the art will recognize that the sorting process illustrated in FIG. 1 is only one of a large variety of sorting techniques that can be applied to screen non-volatile memory devices. Although, for purposes of illustration, the present invention will be illustrated in the context of improving the particular sorting process shown in FIG. 1, the invention is not limited to any one particular sorting methodology. In the illustrated screening method, a device to be screened is stressed or cycled at an initial step 10. Each cell of the device is alternatingly programmed and then erased. The specific operation of programming and erasing depends upon the particular device to be screened. In the present case, a cell of the device is erased if electrons are drawn to and collected on its floating-grate, and a cell of the device is programmed if electrons are drawn away from its floating-gate.

After stressing the device, each cell of the stressed device is erased at step 12. Then, at step 14, a voltage is measured across the floating-gate of each cell of the erased device. In the particular method illustrated in FIG. 1, at step 16, the erased device is stored at a first predetermined temperature for a predetermined time period. This step typically represents a storage period in which the device is stored at room temperature for a certain length of time. In one prior art technique, described in U.S. Pat. No. 5,700,698 to Barsan, et al., the storage period is precisely determined and an attempt is made to maintain the time period within a tolerance of approximately 10%.

After the predetermined time period has elapsed, at step 18, the device is placed in an oven and baked at a second predetermined temperature. The bake is typically carried out at a temperature of greater than about 200° C. with temperatures of about 250° C. being commonly used. The baking process generally lasts for about 24 hours.

At step 20, the device is removed from the baking oven and a voltage value is again measured across the floating-gate of each cell in the device. The voltage values measured at steps 14 and 20 are subtracted, at step 22, to compute a plurality of measured voltage drop values. Each voltage drop value corresponds to a particular cell in the non-volatile memory device. Each of the measured voltage drop values are compared at step 24 to an acceptable predetermined voltage drop value. If any of the measured voltage drop values are greater than an acceptable predetermined voltage drop value, the device is identified as defective and discarded at step 26.

Any method used to screen defective devices must identify devices that will lose a predetermined amount of charge at the end of a specified useful lifetime. Characteristic curves for the predicted charge loss measured as a voltage drop across the floating-gate of the worst cell of memory device is shown in FIG. 2. Curves 28 and 30 represent the charge loss characteristics of a given population of memory cells having distributions about a maximum voltage level and a minimum voltage level, respectively. In the statistical distribution depicted by curve 28, the initial voltage values of the cells are centered about a maximum value (Vtemax), and progressively degrades over time to an end of life value, (EOL). Curve 28 intersects the time axis at some residual voltage value (Vte) and represents the residual charge remaining on the floating-gate electrode at a point in time when charge can no longer be transferred or removed from the floating-gate electrode. Correspondingly, curve 30 depicts the voltage loss over time of a plurality of memory cells statistically grouped about a minimum initial voltage (Vtemin). These devices have the same end of life as the devices depicted by curve 28. Under ideal conditions, devices having initial voltage values of Vtemax or Vtemin will generally exhibit voltage loss over time in accordance with either curve 28 or curve 30.

To ensure that the non-volatile memory devices will function properly until the end of life, indicated by curves 28 and 30, the voltage drop within the worst memory cell of the device must not exceed a specified value at the margin sort read point. The margin sort read point will vary depending upon the particular type of non-volatile memory device being screened, for a PLD having a tunnel oxide thickness of about 70 angstroms, the margin sort read point is preferably about 24 to 72 hours after the initial voltage measurement (defined as time=0). The voltage Vsmin is the minimum acceptable voltage value at the margin sort read point.

The maximum acceptable voltage drop ($\Delta$Vtemax) represents the maximum allowable voltage drop of the worst cell in a non-volatile memory device at the margin sort read point. The voltage drop value ($\Delta$Vte) for three cells A, B, and C are illustrated in FIG. 2. By way of illustration, cell A has a $\Delta$Vte at the margin sort read point that is less than the maximum acceptable voltage drop value $\Delta$Vtemax. Accordingly, cell A should exhibit charge loss characteristics over time in accordance with curve 28 and attain an acceptable end of life.

The $\Delta$Vte value for cell B is also shown in FIG. 2. Cell B has an initial voltage value of Vtemin. At the margin sort read point, the voltage drop of cell B is less than the maximum allowable voltage drop value $\Delta$Vtemax. However, as indicated by the decay curve 32, cell B will not attain an acceptable end of life and the voltage level will decay to the residual value Vte it a point in time well short of an acceptable end of life. Accordingly, a screening method using a voltage drop value at the margin sort read point will not identify cell B as defective.

Cell C has a voltage drop $\Delta$Vte that exceeds the maximum allowable voltage drop $\Delta$Vtemax at the margin sort read point. As shown by decay curve 34, cell C will not achieve the specified end of life, but will prematurely fail well short of the specified end of life. Accordingly, the procedure of screening memory cells based on the voltage drop value at the margin sort read point will effectively screen out defective cells that have an initial voltage value at Vtemax, and that have a voltage drop value exceeding $\Delta$Vtemax at the margin sort read point.

The variation and screening results obtained through evaluation of cells A, B, and C illustrates the deficiency of sorting methods of the prior art, such as the method illustrated in FIG. 1. Where the decision to retain or discard a non-volatile memory device is only dependent upon a voltage drop value determined at the margin sort read point, defective cells having low initial voltage values, such as cell B, will not be identified as defective at the margin sort read point. The inconsistency in cell screening will be realized regardless of the particular storage temperature and time, and the baking temperature and time employed prior to measuring the voltage drop value at the margin sort read point.

The failure to screen defective cells such as cell B is overcome by the non-volatile memory cell screening method of the present invention. By requiring that a cell have an initial voltage between Vtemin and Vtemax, and both a voltage drop value less than the maximum allowable voltage drop value and a voltage value above a Vsmin at the margin sort read point, memory cells that will not achieve an acceptable end of life are effectively screened out at the margin sort read point. When memory cells have 1) an initial voltage value between Vtemax and Vtemin, 2) an acceptable voltage drop value at the margin sort read point, and 3) an acceptable minimum voltage value at the margin sort read point, their decay curves will be substantially parallel to or have a shallower negative slope than the decay curve of cell A (shown in FIG. 2).

The sorting method of the invention is particularly advantageous for screening non-volatile memory cells having tunnel oxide layers of thickness is less than 100 angstroms. Such devices will pass the sorting method only where there tunnel oxide layer is initially capable of supporting a predetermined minimum voltage value. By requiring that the cell show an initial predetermined value, premature charge leakage across very thin tunnel oxide layers can be readily detected.

For example, for a PLD having memory cells with tunnel oxide layer thickness of about 95 Å, Vsmin is about 1.5 volts and the device has a target end of life of about 10 years. Based on a maximum initial Vte of about 3.5 volts and a minimum initial Vte of about 2.0 volts, the maximum voltage drop value should be about 0.5 volts at the margin sort read point. Accordingly, for the PLD to pass the sorting procedure of the invention, its second voltage value must be greater than 1.5 volts and its voltage drop value at the margin sort read point $\Delta$Vtemax must be less than 0.5 volts.

A sorting method in accordance with one embodiment of the invention is illustrated in FIG. 3. At step 40, each cell is stressed by alternatingly programming and erasing the cell. During erase, electrons are drawn through the tunnel oxide and are collected on the floating-gate of each cell of the device. During programming, electrons are attracted from the floating-gate through the tunnel oxide layer and into the substrate.

At step 42, each cell of the device is erased a final time to provide an erased device. Next, at step 44, a voltage across the floating-gate of each cell of the erase device is measured by placing enough voltage on the substrate to cause a current to flow from the floating-gate to the substrate. This voltage is equal to the erase voltage Vte of the floating-gate electrode.

At step 45, the initial voltage value is compared with acceptable minimum voltage (Vtemin) and maximum voltage (Vtemax). The device is discarded if the initial voltage value is not within the range defined by the acceptable minimum and maximum voltages.

At step 46, the erase device is stored at a predetermined temperature for a predetermined period of time. Preferably, the storage temperature is about room temperature and the storage time does not exceed about 24 hours. Next, at step 48, the device is baked at a second predetermined temperature. In accordance with the invention, the second predetermined temperature is at least about 200° C. and more preferably at least about 250° C.

After baking the device, the voltage across the floating-gate of each cell is again measured at step 50. Then, at step 52 the voltage drop value $\Delta$Vte is determined. The voltage drop value is measured at the point and time identified as the margin sort read point in FIG. 2. Then, each of the measured voltage drop values is compared to an acceptable maximum voltage drop value $\Delta$Vtemax. The sorting method is completed by comparing the measured voltage drop value $\Delta$Vte with the maximum acceptable value $\Delta$Vtemax, and comparing the initial voltage value Vte with an acceptable value. If the second voltage value is less than an acceptable value (Vsmin), and if the voltage drop value is greater than an acceptable maximum voltage drop value, the device is identified as defective and discarded. In accordance with the invention, a non-volatile memory device will only pass if both test parameters are satisfied. Thus, the sorting method of the present invention provides a screening technique having a high degree of discrimination. The enhanced level of discrimination achieved by the sorting method of the invention is particularly well suited to evaluating predicted lifetimes of non-volatile memory devices having tunnel oxide layers less than 100 angstroms.

Thus, it is apparent that there has been provided, in accordance with the invention, a method for sorting semiconductor devices having a plurality of non-volatile memory cells that fully meets the advantages set for the above. Those skilled in the art will appreciate that variations and modifications can be made without departing from the spirit of the invention. For example, various storage time and temperatures can be used. Additionally, various baking times and temperatures can be used. Further, a varying amount of stressing through program/erase cycling can be performed to stress the memory cells within the device. It is therefore intended to include within the invention all such variations and modifications as fall within the scope of the appended claims and equivalents thereof.

What is claimed is:

1. A method for sorting a semiconductor device having a plurality of non-volatile memory cells each including a floating-gate transistor comprising the steps of:

alternatingly programming and erasing the device to provide a stressed device;

erasing the stressed device;

measuring a first voltage across the floating-gate of each memory cell to determine an initial voltage value;

baking the device at a predetermined temperature;

measuring a second voltage across the floating-gate of each memory cell, and subtracting the second voltage from the first voltage to determine a voltage drop value; and discarding the device if the second voltage value of any cell is below a predetermined minimum value and if the voltage drop value of the cell exceeds a predetermined maximum voltage drop value.

2. The method of claim 1 further comprising the step of storing the device at a predetermined temperature and for a predetermined time prior to baking the device.

3. The method of claim 2, wherein the step of storing the device comprises storing the device at room temperature, and wherein the step of baking the device comprises baking the device at a temperature above about 200° C.

4. The method of claim 1, wherein the step of baking the device comprises baking the device at a temperature above about 250° C.

5. A method for sorting a semiconductor device having a plurality of non-volatile memory cells each including a floating-gate transistor comprising the steps of:

alternatingly programming and erasing the device to provide a stressed device;

erasing the stressed device;

measuring a first voltage across the floating-gate of each memory cell to determine an initial voltage value;

storing the device for a predetermined period of time at a first temperature;

baking the device at a second temperature;

measuring a second voltage across the floating-gate of each memory cell;

subtracting the first voltage from the second voltage to determine a voltage drop value for each cell; and discarding the device only if: 1) the second voltage value of any cell is below a predetermined minimum initial value; and 2) the voltage drop value of the cell exceeds a predetermined maximum voltage drop value.

6. The method of claim 5, wherein the step of storing the device at a first temperature comprises storing the device at room temperature, and wherein the step of baking the device at a second temperature comprises baking the device at a temperature above about 200° C.

7. The method of claim 5, wherein the step of measuring a second voltage across the floating-gate of each memory cell comprises measuring the second voltage at a predetermined time period after measuring the first voltage.

8. The method of claim 7, wherein the step of measuring a second voltage across the floating-gate of each memory cell comprises measuring the second voltage about 24 to 72 hours after measuring the first voltage.

9. A method for sorting a non-volatile memory device having a plurality of memory cells each including a floating-gate transistor comprising the steps of:

specifying predicted voltage decay characteristics for normal memory cells to determine an end of life target value;

defining a margin sort read point;

specifying a minimum initial voltage value and a maximum voltage drop value at the margin sort read point based on the predicted voltage decay characteristics of normal memory cells;

measuring a first voltage across the floating-gate of each memory cell to determine an initial voltage value;

measuring a second voltage across the floating-gate of each memory cell at the margin sort read point;

determining a voltage drop value from the first and second voltages; and discarding the device if: 1) the second N voltage value of any cell is below the minimum initial value, and 2) the voltage drop value of the cell exceeds the maximum voltage drop value.

10. The method of claim 9, wherein the step of measuring a first voltage across the floating-gate of each memory cell to determine an initial voltage value further comprises the steps of:

determining acceptable minimum and maximum initial voltage values;

comparing the initial voltage value with the acceptable minimum and maximum initial voltage values; and discarding the device if the initial voltage value is not within a range defined by the minimum and maximum initial voltage values.

11. The method of claim 9, wherein the step of specifying a minimum voltage value and a maximum voltage drop value comprises setting the initial voltage value at about 1.5 volts and setting the maximum voltage drop value at about 0.5 volts.

12. The method of claim 9 further comprising the steps of alternatingly programming and erasing the device to provide a stressed device and erasing the stressed device prior to the step of measuring the first voltage.

13. The method of claim 9 further comprising the step of baking the device at a predetermined temperature prior to the step of measuring the second voltage.

14. The method of claim 13, wherein the step of baking the device comprises baking the device at a temperature of no less than about 250° C.

15. The method of claim 13, wherein the step of defining a margin sort read point comprises defining the margin sort read point after the step of baking the device.

16. The method of claim 13 further comprising the step of storing the device at a predetermined temperature and for a predetermined time prior to baking the device.

17. The method of claim 16, wherein the step of storing the device comprises storing the device at room temperature.

18. The method of claim 9, wherein the step of defining a margin sort read point comprises defining the margin sort read point at about 24 to 72 hours after measuring the first voltage.

19. The method of claim 9, wherein the step of specifying predicted voltage decay characteristics for normal memory cells to determine an end of life target value comprises determining an end of life at about 10 years after the step of measuring a first voltage.

20. The method of claim 9, wherein the step of determining a voltage drop value from the first and second voltages comprises measuring the first and second voltages across a tunnel oxide layer having a thickness of less than about 100 angstroms and subtracting the first voltage from the second voltage to determine a voltage drop value for each cell.

* * * * *

UNITED STATES PATENT AND TRADEMARK OFFICE
CERTIFICATE OF CORRECTION

PATENT NO. : 6,075,724  
DATED : June 13, 2000  
INVENTOR(S) : Xiao-Yu Li et al.

Page 1 of 1

It is certified that error appears in the above-identified patent and that said Letters Patent is hereby corrected as shown below:

<u>Column 8,</u>
Line 9, delete "N"

Signed and Sealed this

Thirty-first Day of July, 2001

*Attest:*

*Attesting Officer*

NICHOLAS P. GODICI
*Acting Director of the United States Patent and Trademark Office*